United States Patent [19]

Seidel

[11] 3,911,369

[45] Oct. 7, 1975

[54] POSTDISTORTION COMPENSATION OF FREQUENCY CONVERTERS

[75] Inventor: Harold Seidel, Warren, N.J.

[73] Assignee: Bell Telephone Laboratories, Incorporated, Murray Hill, N.J.

[22] Filed: Sept. 3, 1974

[21] Appl. No.: 502,727

[52] U.S. Cl. .................................. 328/163; 328/167

[51] Int. Cl.$^2$ ............................................ H04B 1/04

[58] Field of Search ........... 332/37 R; 328/162, 163, 328/165, 167; 325/472, 474, 475, 479, 481

[56] References Cited

UNITED STATES PATENTS

| | | | |
|---|---|---|---|
| 2,987,617 | 6/1961 | Loughlin | 325/472 X |
| 3,159,790 | 12/1964 | Pratt | 325/475 X |
| 3,493,876 | 2/1970 | Zimmerman | 328/167 |
| 3,539,925 | 11/1970 | Seidel | 325/472 X |
| 3,732,502 | 5/1973 | Seidel | 330/149 |

*Primary Examiner*—James B. Mullins
*Attorney, Agent, or Firm*—S. Sherman

[57] ABSTRACT

Undesirable higher order modulation components produced by a frequency converter are reduced by means of a second, weakly excited frequency converter. The latter, connected in parallel with the former, generates higher order terms which are injected into a common output wavepath out of time phase with the higher order terms produced by the principle frequency converter. By controlling the relative amplitudes of the local oscillator signals coupled to the two converters, the higher order components can be made to cancel whereas the desired linear signal components generated by the principle converter are substantially unaffected.

4 Claims, 4 Drawing Figures

POSTDISTORTION COMPENSATION OF FREQUENCY CONVERTERS

This application relates to arrangements for minimizing signal distortion in electromagnetic wave frequency converters.

BACKGROUND OF THE INVENTION

In U.S. Pat. No. 3,732,502 predistortion and postdistortion compensation circuits are described for minimizing nonlinear effects in signal amplifiers. It is a feature of these circuits that the output from the distortion generator corresponds solely to the higher order amplifier distortion terms. The linear signal component is selectively suppressed. In this way there is no possibility of modifying the linear characteristic of the amplifier when the distortion compensating components are injected into the principal signal wavepath.

Nonlinear effects in a frequency converter give rise to intermodulation effects which generate spurious signals within the band of interest. Inasmuch as a frequency converter spans two different frequency ranges, there is no comparable means, using passive circuit elements, of generating only the desired distortion compensating signals while suppressing the linear signal component. Nevertheless, such suppression is highly desirable.

It is, accordingly, the broad object of the invention to reduce the distortion in frequency converters.

It is a more specific object of the invention to cancel nonlinear frequency conversion signal components in a frequency converter use postdistortion compensation techniques without significantly affecting the linear signal components.

SUMMARY OF THE INVENTION

In accordance with the present invention, the distortion generator for minimizing intermodulation distortion effects in a frequency converter comprises a second, weakly excited frequency converter. (In order to distinguish the principal frequency converter from the distortion generator, the former shall be referred to hereinafter as the "frequency converter" or "converter," and the distortion generator shall be referred to hereinafter as the "weak mixer," or simply the "mixer.")

The weak mixer circuit is coupled in parallel with the frequency converter such that a portion of the input signal applied to the converter is also coupled to the input of the weak mixer, and a portion of the output signal from the weak mixer is coupled back into the output circuit of the frequency converter. Both the converter and mixer are energized by means of a common local oscillator.

It is shown that by weakly exciting the mixer, a high level of nonlinear signal components are produced relative to the level of the linear components. Specifically, the total cancellation of the intermodulation distortion is achieved when the local oscillator signal $V_1$ coupled to the frequency converter, and the local oscillator signal $V_2$ coupled to the weak mixer are related by $$V_2 = \frac{V_1}{L},$$

where L is the total transmission loss through the input and output couplers connecting the weak mixer to the principal circuit.

These and other objects and advantages, the nature of the present invention, and its various features will appear more fully upon consideration of the various illustrative embodiments now to be described in detail in connection with the accompanying drawings.

DETAILED DESCRIPTION

Figure 1:
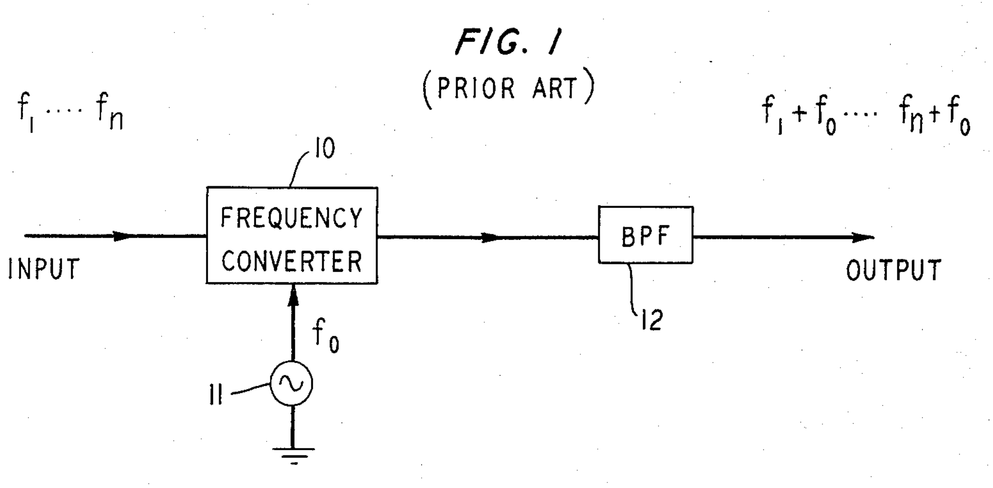
FIG. 1 (PRIOR ART)
FIG. 1 shows a typical prior art frequency translating circuit.

Referring to the drawings, FIG. 1 shows, in block diagram, a typical prior art frequency translating circuit comprising a frequency converter 10, a local oscillator 11, and an output filter 12.

Figure 2:
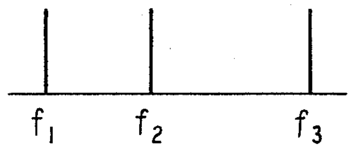
FIG. 2 and 3 show, respectively, the input signal components to the frequency translating circuit of FIG. 1, and the useful output sum frequency components along with an intermodulation distortion component.
Figure 3:
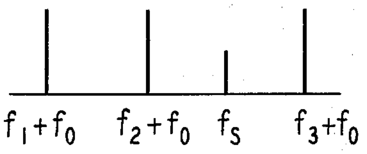

In operation, the input signal interacts with the local oscillator signal to produce output signal components at a number of different frequencies. From among these, the desired output signal components are selected by the output filter. For example, let us assume a local oscillator frequency $f_o$, and an input signal having frequency components at frequencies $f_1$, $f_2$ and $f_3$, as illustrated in FIG. 2. In a linear frequency converter, the output signal from the converter will include frequency components at frequencies $f_1$, $f_2$, $f_3$, $f_o$, and at frequencies $f_1 \pm f_o$, $f_2 \pm f_o$ and $f_3 \pm f_o$. If, for purposes of illustration, we further assume that filter 12 is designed to pass the sum frequencies, the output signal derived from the filter will comprise only frequencies $f_1 + f_o$, $f_2 + f_o$ and $f_3 + f_o$, as illustrated in FIG. 3.

The difficulty, however, is that frequency converters are linear devices over only a limited dynamic range and, as a result, higher order frequency components are produced. These typically include terms such as $(2f_1 - f_3) + f_o$, $(f_1 + f_3 - f_2) + f_o$, among others, which may also fall within the passband of filter 12 and appear in the output as a spurious signal $f_s$. These so-called intermodulation distortion terms, particularly those oddorder terms indicated above, are highly undersirable in communication systems as they cause crosstalk. At present the deleterious effect of crosstalk on the system is minimized by limiting the number of channels so as to restrict the operation of the frequency converter to within its linear range. This, however, is wasteful of spectral space. A preferable solution to the problem is to increase effectively the dynamic linear range of the converter so that it is capable of handling a larger number of channels while still maintaining an acceptable level of spurious signals.

Figure 4:
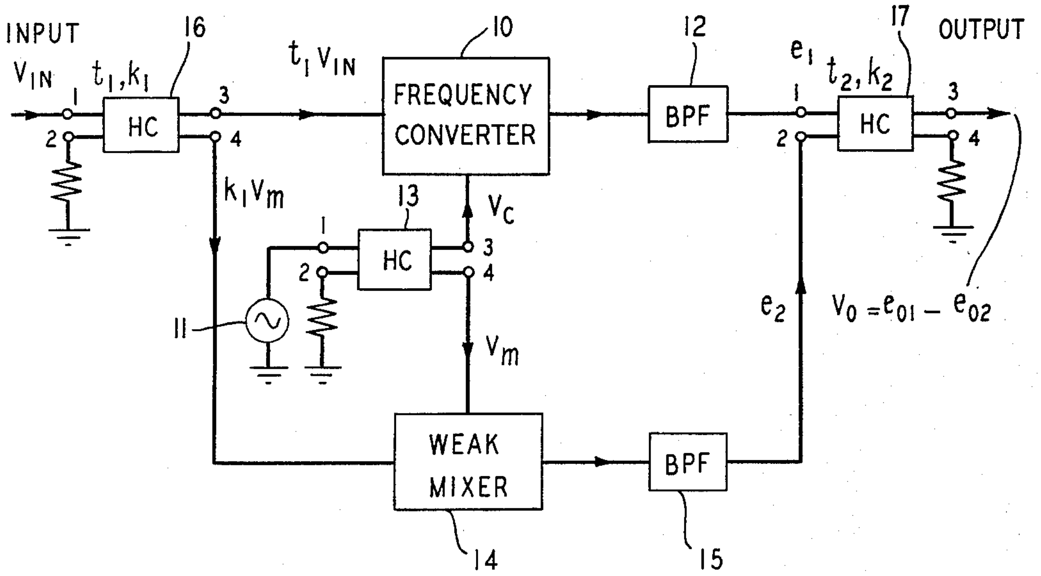
FIG. 4 shows a frequency translating circuit in accordance with the present invention.

FIG. 4, now to be considered, illustrates a postdistortion compensation arrangement for reducing intermodulation distortion effects in frequency converters in accordance with the teachings of the present invention. Using the same identification numerals used in FIG. 1 to identify corresponding components, the embodiment of FIG. 4 comprises a principal frequency translation circuit including a frequency converter 10, a local oscillator 11, and an output filter 12. The embodiment of FIG. 4 also includes a distortion generator circuit comprising a second frequency converter 14 and a second filter 15. Both frequency converters 10 and 14 are energized by the same local oscillator 13. The relative magnitudes of the local oscillator signals coupled to the respective converters is controlled by a suitable coupling network 13 which, for purposes of illustration, is shown to be a hybrid coupler.

Because the magnitude of the local oscillator signal coupled to converter 14 is much less than the magnitude of the local oscillator signal coupled to the principal converter 10, for reasons which will be explained in greater detail hereinbelow, converter 14 is referred to hereinafter as the "weak mixer" or simply as the "mixer."

The input signal is coupled simultaneously to converter 10 and mixer 14 by means of an input hybrid coupler 16. The filtered output from mixer 14 and the filtered output from converter 10 are coupled to a common output wavepath by means of an output hybrid coupler 17.

In operation, an input signal $V_{in}$ is applied to port 1 of input coupler 16, producing signals $t_1V_{in}$ and $k_1V_{in}$ at input coupler ports 3 and 4, respectively, where $t_1$ is the coefficient of transmission, and $k_1$ is the coefficient of coupling of input coupler 16.

Simultaneously, a local oscillator signal $V_c$ is applied to converter 10 and a local oscillator signal $V_m$ is applied to mixer 14.

With input signal $t_1V_{in}$ and local oscillator signal $V_c$ applied to converter 10, an output signal $e_1$ given by $$e_1 = C_1t_1V_{in}\left[1 - \alpha_1\left(\frac{t_1V_{in}}{V_c}\right)^2\right] \quad (1)$$

is produced, where $C_1$ and $\alpha_1$ are constants, characteristic of the converter circuit.

Similarly, input signal $k_1V_{in}$ and local oscillator signal $V_m$, applied to mixer 14 produce an output signal $e_2$ given by $$e_2 = C_2k_1V_{in}\left[1 - \alpha_2\left(\frac{k_1V_{in}}{V_m}\right)^2\right] . \quad (2)$$

where $C_2$ and $\alpha_2$ are constants, characteristic of the mixer circuit.

The two signals $e_1$ and $e_2$ are coupled to a common output circuit by means of output coupler 17. The resulting two output signals $e_{01}$ and $e_{02}$ are then $$e_{01} = t_2e_1 = C_1t_2t_1V_{in}\left[1 - \alpha_1\left(\frac{t_1V_{in}}{V_c}\right)^2\right] . \quad (3)$$

$$e_{02} = k_2e_2 = C_2k_2k_1V_{in}\left[1 - \alpha_2\left(\frac{k_1V_{in}}{V_m}\right)^2\right] . \quad (4)$$

Performing the indicated multiplication, one obtains $$e_{01} = C_1t_2t_1V_{in} - C_1\alpha_1\frac{t_2t_1{}^3V_{in}{}^2}{V_c2} . \quad (5)$$

and $$e_{02} = C_2k_2k_1V_{in} - C_2\alpha_2\frac{k_2k_1{}^3V_{in}{}^2}{V_m2} . \quad (6)$$

As indicated hereinabove, the purpose of including the weak mixer is to generate distortion components which cancel the distortion components produced by the principal frequency converter. Accordingly, the two signals $e_{01}$ and $e_{02}$ are combined 180° out of phase such that the resulting output signal $V_o$ is $$V_o = e_{01} - e_{02} . \quad (7)$$

Substituting for $e_{01}$ and $e_{02}$ from equations (5) and (6) yields $$V_o = (C_1t_1t_2 - C_2k_1k_2)V_{in} + \left[\frac{-C_1\alpha_1t_2t_1{}^3V_{in}{}^2}{V_c2} + \frac{C_2\alpha_2k_2k_1{}^3V_{in}{}^2}{V_m2}\right] . \quad (8)$$

For the nonlinear term to vanish we set $$\frac{C_1\alpha_1t_2t_1{}^3V_{in}}{V_c2} = \frac{C_2\alpha_2k_2k_1{}^3V_{in}{}^2}{V_m2} , \quad (9)$$

from which we derive $$V_m = V_c \cdot \sqrt{\frac{C_2\alpha_2}{C_1\alpha_1}} \cdot \sqrt{\frac{k_1k_2}{t_1t_2}} \cdot \frac{k_1}{t_1} . \quad (10)$$

Equation (10) defines the magnitude $V_m$ of the local oscillator signal coupled to the weak mixer relative to the magnitude $V_c$ of the local oscillator signal coupled to the frequency converter in terms of the converter and mixer constants and the input coupler and output coupler coefficients of coupling and transmission.

In order that the linear term $C_2k_1k_2V_{in}$ generated by mixer 14 have a negligible effect upon the desired, linear output signal $C_1t_1t_2V_{in}$ from converter 10, each of the coupling coefficients $k_1$ and $k_2$ of couplers 16 and 17 is advantageously made to be much smaller than the respective transmission coefficients $t_1$ and $t_2$. With $k_1 < t_1$, and $k_2 < t_2$, $k_1k_2$ is much smaller than $t_1t_2$ and, hence, the linear term $C_2k_1k_2V_{in}$ is much smaller than $C_1t_1t_2V_{in}$.

In addition, the numerator term $\sqrt{k_1k_2} \cdot k_1$ of equation (10) is much smaller than the denominator term $t_1t_2 \cdot t_1$ and, hence, $V_m$ is much smaller than $V_c$. It is for this reason that converter 14 is referred to as the "weak mixer".

If the same kind of circuit is used for both converter 10 and mixer 14, the converter circuit constants $C_1\alpha_1$ and $C_2\alpha_2$ will be equal. Similarly, by using input and output couplers having the same signal division ratio, $k_1 = k_2 = k$, and $t_1 = t_2 = t$. Making these several substitutions, equation (10) reduces to $$V_m = V_c \cdot \frac{k^2}{t^2} . \quad (11)$$

Noting, also that $|k^2| + |t^2| = 1$, equation (11) can be rewritten as $$V_m = V_c \cdot \frac{k^2}{1-K^2}. \quad (12)$$

Since $k^2$ is advantageously much less than one, equation (13) can be further simplified to $$V_m \approx V_c K^2. \quad (13)$$

Alternatively, equation (13) can be expressed as $$V_m \approx \frac{V_c}{L}, \quad (14)$$

where L is the signal transmission power loss between the input and output ends of the circuit through the distortion generator wavepath.

EXAMPLE

As indicated above, the coefficient of coupling $k$ of the input and output couplers is advantageously made small compared to the coefficient of transmission $t$ so as to minimize the magnitude of the linear signal component derived from the weak mixer and injected into the output circuit. A second reason for making $k$ small is to reduce the signal loss through the couplers experienced by the signals coupled to and derived from the converter. Thus, it would appear that the smaller $k$ is made, the better the overall performance. This, however, is only correct within limits. Specifically, the lower limit is set by the level of the higher order distortion terms generated by the weak mixer. These will become significant as the magnitude of the local oscillator signal coupled to the weak mixer is reduced. It will be noted from equation (13) that $V_m$ is proportional to $k^2$. As such, $V_m$ decreases at a greater rate than $k$. Since equation (2) takes into consideration only one nonlinear term, higher order terms will not necessarily be cancelled in the output circuit. Thus, whereas the first order nonlinear terms will be cancelled as $k$ is made smaller, higher order terms generated by the weak mixer may not be. Accordingly, a typical value for $k$ would be about 10dB. This will result in a total voltage transmission loss for the linear signal components of about 10 percent, and a cancellation loss of about one percent, for a total loss of about 1.9dB. Whether or not s smaller $k$ could be used would depend upon the type of converter employed and the particular application at hand.

As in all feedforward type error correction systems, time and phase equalization may be required to affect the desired error cancellation in the output circuit. Accordingly, time delay networks and phase shifters (not shown) should be added to one or both of the two parallel wavepaths, as required. Thus, in all cases it is understood that the above-described arrangements are illustrative of a small number of the many possible specific embodiments which can represent applications of the principles of the invention. Numerous and varied other arrangements can readily be devised in accordance with these principles by those skilled in the art without departing from the spirit and scope of the invention.

What is claimed is:

1. In combination:

a first frequency converter having a nonlinear frequency conversion characteristic resulting in the generation of intermodulation distortion signal components;

a second frequency converter having a nonlinear frequency conversion characteristic;

means for coupling the input ends of said converters to a common input circuit;

means for coupling the output ends of said converters to a common output circuit;

and a common local oscillator coupled to both of said converters;

Characterized in that:

the magnitude of the local oscillator signal coupled to said second converter is less than the magnitude of the local oscillator signal coupled to said first converter;

and in that the output signals from said frequency converters are combined in said common output circuit out of phase such that the magnitude of the resulting intermodulation distortion signal components appearing in said common output circuit is less than that produced by said first frequency converter operating alone.

2. The combination according to claim 1 wherein:

said frequency converters are coupled to said common input circuit by means of an input coupler having a coefficient of transmission $t_1$ between said input circuit and said first converter, and a coefficient of coupling $k_1$ between said input circuit and said second converter;

said frequency converters are coupled to said common output circuit by means of an output coupler having a coefficient of transmission $t_2$ between said first converter and said output circuit, and a coefficient of coupling $k_2$ between said second converter and said output circuit;

and wherein the magnitude $V_m$ of the local oscillator signal coupled to said second converter, and the magnitude $V_c$ of the local oscillator signal coupled to said first converter are related by $$V_m = V_c \sqrt{\frac{C_2\alpha_2}{C_1\alpha_1}} \cdot \sqrt{\frac{k_1k_2}{t_1t_2}} \cdot \frac{k_1}{t_1},$$

where $C_1\alpha_1$ and $C_2\alpha_2$ are characteristic constants of said first and second converters, respectively.

3. The combination according to claim 2 wherein $C_1\alpha_1 = C_2\alpha_2$ $k_1 = k_2 = k$ and $t_1 = t_2 = f$.

4. The combination according to claim 3 wherein $k < t$ and $V_m \approx V_c k^2$.

* * * * *